United States Patent
Taguchi

(10) Patent No.: US 6,768,145 B1
(45) Date of Patent: Jul. 27, 2004

(54) SEMICONDUCTOR INTEGRATED CIRCUIT DEVICE

(75) Inventor: Yoshihide Taguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/408,260

(22) Filed: Apr. 8, 2003

(30) Foreign Application Priority Data

Feb. 3, 2003 (JP) ........................................ 2003-026226

(51) Int. Cl.[7] ............................................ H01L 29/80
(52) U.S. Cl. ........................ 257/273; 257/273; 257/552
(58) Field of Search ................................ 257/273, 552, 257/135, 205, 361, 363, 370, 539

(56) References Cited

U.S. PATENT DOCUMENTS

| 5,119,263 A | 6/1992 | Gariboldi et al. |
| 5,185,649 A | 2/1993 | Bertotti et al. |
| 5,475,340 A | 12/1995 | Gose |
| 5,546,260 A | * 8/1996 | Pease et al. ................... 361/18 |

* cited by examiner

Primary Examiner—David Nelms
Assistant Examiner—Thinh T Nguyen
(74) Attorney, Agent, or Firm—Oblon, Spivak, McClelland, Maier & Neustadt, P.C.

(57) ABSTRACT

A semiconductor integrated circuit device includes a second conduction type first diffusion region formed in a surface of a first conduction type semiconductor substrate. A first conduction type second diffusion region is formed in the first diffusion region, a second conduction type third diffusion region is formed in the second diffusion region, and a first conduction type fourth diffusion region is formed in the third diffusion region. A current measuring section measures a current value of current flowing through the second diffusion region, and outputs a current value signal in accordance with the measured current value. A control section is supplied with the current value signal, and supplies control current to the first diffusion region in accordance with the current value signal. A first resistor element has a first terminal connected with the first diffusion region and a second terminal connected with the second diffusion region.

10 Claims, 5 Drawing Sheets

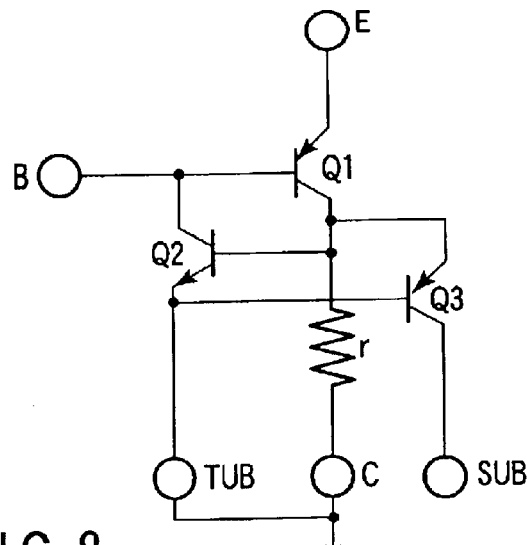
F I G. 8
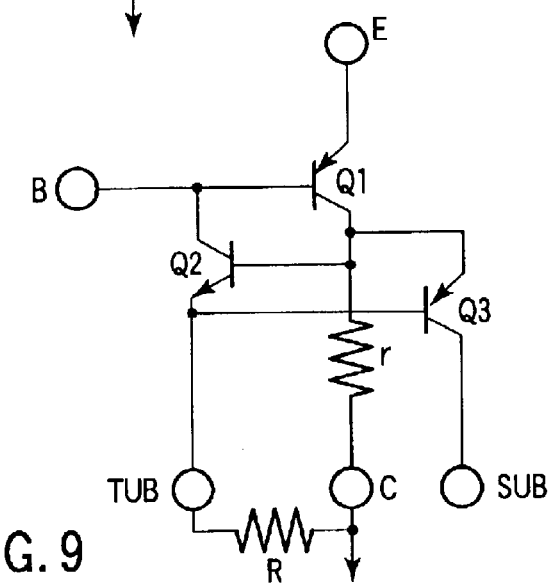
F I G. 9
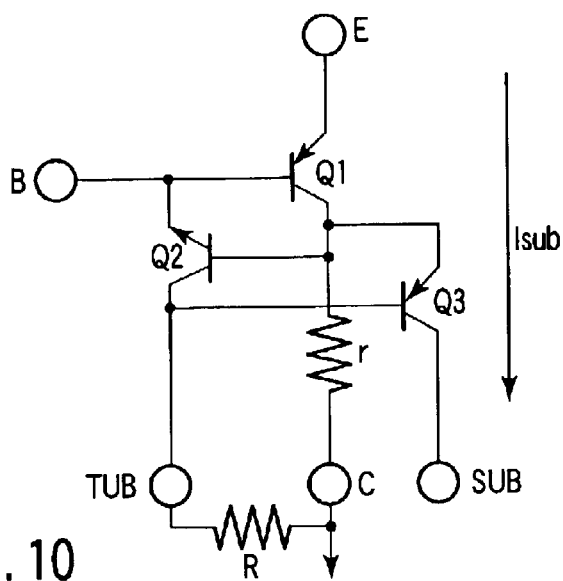
F I G. 10

SEMICONDUCTOR INTEGRATED CIRCUIT DEVICE

CROSS-REFERENCE TO RELATED APPLICATIONS

This application is based upon and claims the benefit of priority from the prior Japanese Patent Application No. 2003-026226, filed Feb. 3, 2003, the entire contents of which are incorporated herein by reference.

BACKGROUND OF THE INVENTION

1. Field of the Invention

The present invention relates to a semiconductor integrated circuit device, and in particular, to a semiconductor integrated circuit device having a vertical type bipolar transistor.

2. Description of the Related Art

In a semiconductor integrated circuit (IC) device having a bipolar transistor formed on a semiconductor substrate, a diffusion region is formed around the bipolar transistor in order to electrically isolate the transistor from other transistor elements (not shown).

FIG. 5 is a cross-sectional view showing the basic structure of the transistor formed on the semiconductor substrate. As seen from FIG. 5, an N-type diffusion region (first diffusion region) tub for electric isolation is formed in a P-type semiconductor substrate sub forming an IC. A vertical type bipolar transistor Q1 is formed in the diffusion region tub. That is, a p-type diffusion region (second diffusion region) c is formed in the diffusion region tub, and an N-type diffusion region (third diffusion region) b is formed in the diffusion region c, and further, a P-type diffusion region (fourth diffusion region) e is formed in the diffusion region b. An electrode TUB, collector electrode C, base electrode B and emitter electrode E are formed on the semiconductor substrate sub in the diffusion region tub, diffusion region c, diffusion region b and diffusion region e, respectively. A substrate electrode SUB is formed on the semiconductor substrate sub outside the above diffusion regions.

A voltage is applied to the diffusion region tub and the diffusion region c and the semiconductor substrate sub so that each PN junction between the diffusion region tub and diffusion region c and between the diffusion region tub and the semiconductor substrate sub are reverse-biased. By doing so, the semiconductor substrate sub and the diffusion region c are electrically isolated.

As shown in FIG. 5, parasitic transistors (hereinafter, referred simply to as transistor) Q2 and Q3 and a distributed resistor (hereinafter, referred simply to as resistor) r are formed by the diffusion region tub, the diffusion region c, the diffusion region b and the diffusion region e. The transistor Q1, the transistor Q2, the transistor Q3 and the resistor r form an equivalent circuit shown in FIG. 6. The transistor Q2, the transistor Q3 and the resistor r are formed, thereby causing the following problem in accordance with biasing to the diffusion region tub.

As depicted in FIG. 7, for example, the highest potential of IC, that is, a potential (typically, power-supply potential) Vcc is applied to the electrode TUB. By doing so, each PN junction formed between the diffusion region tub and the diffusion region c and between the diffusion region tub and the semiconductor substrate sub is always reverse-biased. However, the above biasing is not used if the breakdown voltage between the diffusion region c and the diffusion region tub is low. In addition, if the collector electrode C is connected to an external device, there is a possibility that a potential more than the above potential Vcc is applied to the collector electrode C. As a result, the junction between the electrode TUB and the collector electrode C is forward-biased; therefore, large current flows through the electrode TUB in the forward direction of a diode d. For this reason, the PN junction between the diffusion region tub and the diffusion region c is broken down, and an excessive load is given to the device connected with the collector electrode C.

Another biasing to the diffusion region tub is employed such that the electrode TUB and the collector electrode C are connected as shown in FIG. 8. According to the above biasing, the diffusion region tub and the diffusion region b have the same potential; for this reason, the PN junction between the diffusion region tub and the diffusion region b is not tuned on even if a potential more than the potential Vcc is applied to the collector electrode C. Therefore, it is possible to prevent excessive current from flowing through the transistor Q1. However, according to the above biasing, the transistor Q1 and the transistor Q2 form a thyristor structure; for this reason, latch-up is easy to occur. More specifically, when a collector current of the transistor Q1 becomes a predetermined value with the operation of the transistor Q1, the transistor Q2 is turned on by the potential difference generated across the resistor r. As a result, a collector current of the transistor Q2, that is, a base current of the transistor Q1 increases, thereby increasing a current carrying the collector-emitter junction of the transistor Q1. According to the above positive feedback, a large current flows through the transistor Q1; for this reason, there is a possibility that the transistor Q1 is broken down.

Another biasing is employed such that a resistor element R is interposed between the electrode TUB and the collector electrode C as shown in FIG. 9. According to the above biasing, in the above latch-up operation process, the current becomes hard to flow between the collector and the emitter of the transistor Q2; therefore, the latch-up is prevented. The larger the value of the resistor element R is, more effective it is to prevent the latch-up. However, too large value of the resistor element R causes the following problem. That is, as shown in FIG. 10, when the transistor Q1 is saturated, the potential high and low relationship between the electrode B and the electrode TUB is inverted followed by inversion of a bias direction of the transistor Q2, which causes the emitter and collector of the transistor Q2 to operate in a inverted state of the those of the FIG. 5. As a result, the current flows from the collector of the transistor Q2 to the emitter thereof. However, because the value of the resistor element R is large, the collector potential of the transistor Q2 decreases. Therefore, the transistor Q2 is saturated. Whereupon, the base-emitter junction of the transistor Q3 is forward-biased, so that the transistor Q3 can be turned on. The transistor Q3 is turned on; as a result, the collector current of the transistor Q1 flows into the semiconductor substrate via the transistor Q3 (substrate current Isub). In particular, because the transistor Q3 has a large area on the substrate plane, it is easy to turn on even if the bias of the base-emitter junction is small. As a result, the above problem remarkably appears.

BRIEF SUMMARY OF THE INVENTION

According to a first aspect of the present invention, there is provided a semiconductor integrated circuit device comprising: a first conduction type semiconductor substrate; a second conduction type first diffusion region formed in a surface of the semiconductor substrate; a first conduction type second diffusion region formed in the first diffusion region; a second conduction type third diffusion region formed in the second diffusion region; a first conduction type fourth diffusion region formed in the third diffusion region; a current measuring section measuring a current value of current flowing through the second diffusion region, and outputting a current value signal in accordance with the measured current value; a control section supplied with the current value signal, and supplying control current to the first diffusion region in accordance with the current value signal; and a first resistor element having a first terminal connected with the first diffusion region, and a second terminal connected with the second diffusion region.

According to a second aspect of the present invention, there is provided a semiconductor integrated circuit device comprising: a first conduction type semiconductor substrate; a second conduction type first diffusion region formed in a surface of the semiconductor substrate; a first conduction type second diffusion region formed in the first diffusion region; a second conduction type third diffusion region formed in the second diffusion region; a first conduction type fourth diffusion region formed in the third diffusion region; a current measuring section measuring a current value of current flowing through the fourth diffusion region, and outputting a current value signal in accordance with the measured current value; a control section supplied with the current value signal, and supplying control current to the first diffusion region in accordance with the current value signal; and a first resistor element having a first terminal connected with the first diffusion region, and a second terminal connected with the second diffusion region.

BRIEF DESCRIPTION OF THE SEVERAL VIEWS OF THE DRAWING

FIG. 8 is a view showing another biasing to the circuit shown in FIG. 6;

FIG. 9 is a view showing another biasing to the circuit shown in FIG. 6; and

FIG. 10 is a view showing problems arisen by the above biasing shown in FIG. 9.

DETAILED DESCRIPTION OF THE INVENTION

Figure 1:
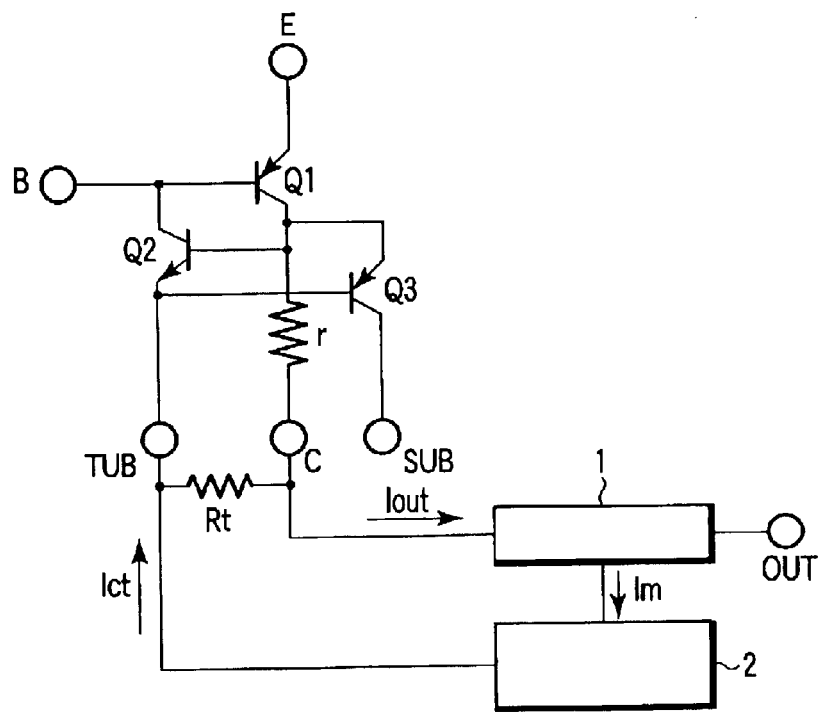
FIG. 1 is a block diagram schematically showing a semiconductor integrated circuit device according to a first embodiment of the present invention.

Embodiments of the present invention will be described below with reference to the accompanying drawings. In the following description, the same reference numerals are given to the components having the substantially same function and configuration, and the overlapping explanation will be made if necessary only.

First Embodiment

Figure 5:
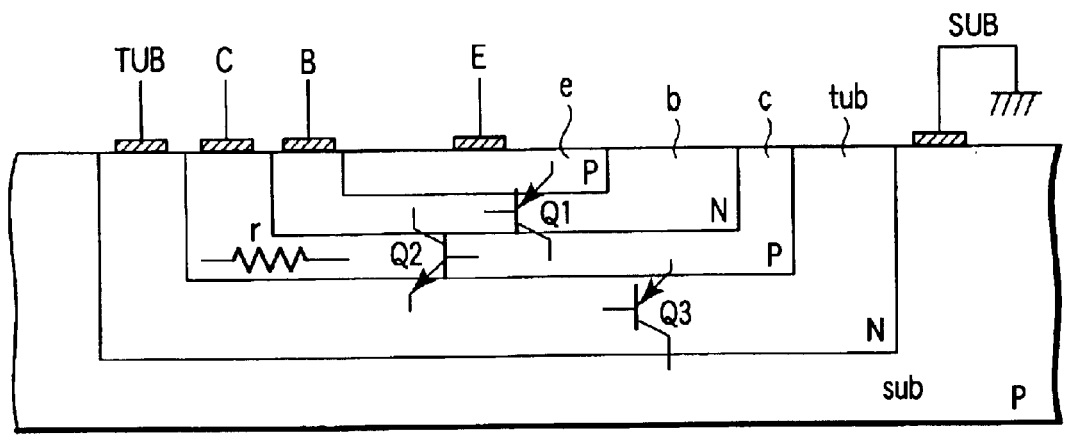
FIG. 5 is a cross-sectional view showing the basic structure of a vertical type bipolar transistor formed on a semiconductor substrate.
Figure 6:
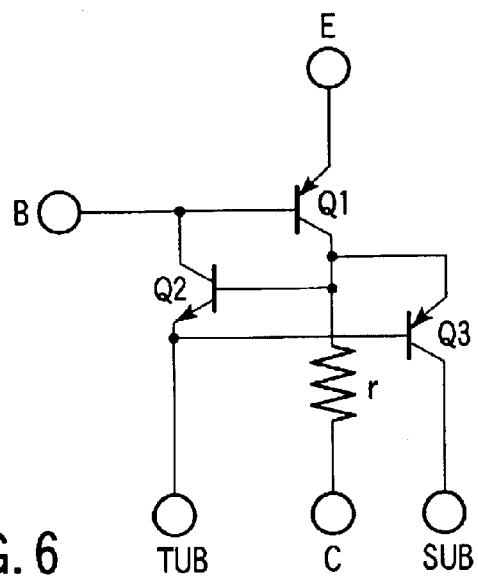
FIG. 6 is a view showing an equivalent circuit of FIG. 5.
Figure 7:
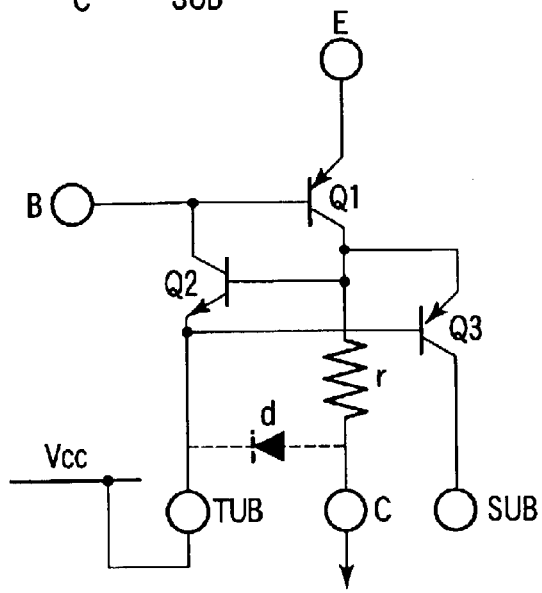
FIG. 7 is a view showing biasing to the circuit shown in FIG. 6.

FIG. 1 is a view schematically showing a semiconductor integrated circuit device according to a first embodiment of the present invention. As shown in FIG. 1, the transistor Q2, the transistor Q3 and the resistor r are formed by the diffusion region b, the diffusion region c, the diffusion region tub and the semiconductor substrate sub shown in FIG. 5. The connection relationship between the transistor Q2, the transistor Q3 and the resistor r is the same as the conventional case.

A resistor (first resistor) element Rt is interposed between the collector electrode C and the electrode TUB. A current measuring section 1 is interposed between the collector electrode C and an output terminal OUT. The current measuring section 1 measures a current value flowing between the collector electrode C and the output terminal OUT, and outputs a current value signal Im in accordance with the measured current value. The current value signal Im is supplied to a control section 2. The control section 2 outputs a control current (signal) Ict in accordance with the current value signal Im. The control current Ict and the current value signal Im may be set to have a proportional relationship, for example. The control current is supplied to the electrode TUB.

The following is a description on the operation of the semiconductor integrated circuit device having the above configuration. In a state that a predetermined potential is applied to an emitter electrode E, a potential forward-biasing the junction between a base electrode B and the emitter electrode E is applied to the base electrode B. As a result, the transistor Q1 is turned on, and the current flows through the emitter-collector junction of the transistor Q1; therefore, the collector current (output current Iout) flowing from the collector electrode C flows. The output current Iout is measured by the current measuring section 1, thereafter, in accordance with the current value of the output current Iout, the current value signal Im is supplied to the control section 2. The control section 2 outputs the control current Ict in accordance with the current value of the current value signal Im. The control current Ict generates a potential difference across the resistor element Rt, therefore the emitter potential of the transistor Q2 steps up. As a result, the current flowing through the collector-emitter junction of the transistor Q2 is limited.

As described in the conventional case of FIG. 9, the collector current of the transistor Q1, that is, the output current Iout increases and then the current flowing through the transistor Q2 increases. The increase of the current flowing through the transistor Q2 makes latch-up phenomenon to occur easily. On the contrary, the circuit device in the first embodiment of the present invention is configured so that the increase of output current Iout raises the potential of the electrode TUB. As a result, the current flowing through the transistor Q2 is limited, and thereby, the generation of the latch-up phenomenon can be prevented.

In order to prevent occurring the latch-up, it is effective to make large the potential difference between the electrode C and the electrode TUB as described above. In order to make large the potential difference, the value of the resistor element interposed between the electrode C and the electrode TUB in the conventional example. On the contrary, the control current Ict and the resistor element Rt generates the potential difference between the electrode C and the electrode TUB in the first embodiment. Therefore, with a large control current Ict, it is possible to make large the potential difference between the electrodes C and TUB. As a result, there is no need of a large value of the resistor element Rt. A limited small value of the resistor element Rt can reduce the value of a substrate current Isub flowing when the transistor Q1 is saturated.

Figure 2:
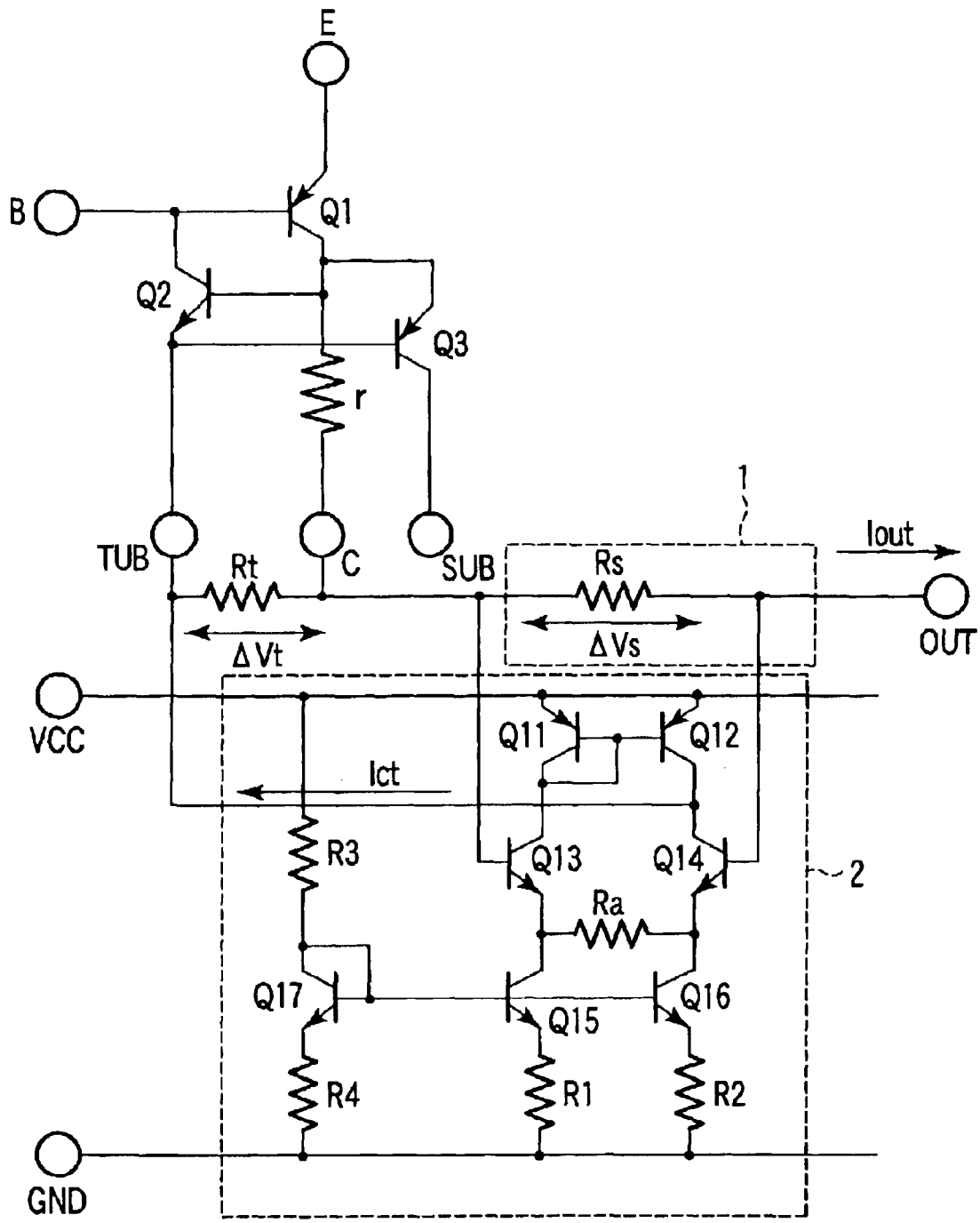
FIG. 2 is a view showing a circuit configuration for realizing the device shown in FIG. 1.

The following is a description on the circuit configuration of the semiconductor integrated circuit device shown in FIG. 1. FIG. 2 is a view showing a circuit configuration for realizing the device shown in FIG. 1. As seen from FIG. 2, the collector electrode C is connected with the output terminal OUT via a current measuring resistor (second resistor) element Rs constituting the current measuring section 1. A signal corresponding to the current value signal Im of FIG. 1 is fetched from both terminals of the current measuring section 1. The control section 2 is configured using a differential amplifier circuit. The differential amplifier circuit is composed of a pnp-type transistor Q11, a pnp-type transistor Q12, an npn-type transistor Q13, an npn-type transistor Q14 and a resistor element Ra. Each emitter of the transistor Q11 and the transistor Q12 is connected with a power supply terminal VCC to which a power supply potential is supplied. The base of the transistor Q11 is connected with the collector thereof while being connected with the base of the transistor Q12.

The collector of the transistor Q11 is grounded via series-connected an npn-type transistor Q13, an npn-type transistor Q15 and a resistor element R1. The collector of the transistor Q12 is grounded via series-connected an npn-type transistor Q14, an npn-type transistor Q16 and a resistor element R2. The resistor element Ra is connected between the emitter of the transistor Q13 and the emitter of the transistor Q14. The resistor element Ra has a function of determining the gain of the differential amplifier circuit.

The base of the transistor Q13 is connected with a connection node of the collector electrode C and the current measuring resistor element Rs. The base of the transistor Q14 is connected with a connection node of the current measuring resistor element Rs and the output terminal OUT. Each connection node of the transistor Q12 and the transistor Q14 is connected with the electrode TUB. The control current Ict is fetched from the connection node.

In the control section 2, the power supply terminal VCC is grounded via a resistor R3, an npn-type transistor 17 and a resistor R4, which are connected in series. The base of the transistor Q17 is connected to the collector thereof and each base of the transistor Q15 and the transistor Q16.

The operation of the circuit shown in FIG. 2 will be schematically described below. When the output current Iout increases with the operation of the transistor Q1, a potential difference ΔVs is generated across the current measuring resistor element Rs in accordance with the values of the output current Iout and the current measuring resistor element Rs. The potential difference ΔVs is linearly amplified by the differential amplifier circuit, and thereby, the control current Ict flows in accordance with the amplified potential difference. In a state that the transistor Q2 does not operate, the electrode TUB and the electrode C have the same potential. However, when the control current Ict flows, voltage drop by the current measuring resistor element Rs occurs. For this reason, a potential difference ΔVt is generated across the current measuring resistor element Rt in accordance with the values of the control current Ict and the resistor element Rt. The operation after that is the same as described in FIG. 1.

The following is a description on the procedure for determining the value of the resistor element Ra included in the control section 2.

The potential difference ΔVs across both terminals of the current measuring resistor element Rs is determined by the following equation (1).

$$\Delta Vs = Iout \times Rs \quad (1)$$

In accordance with the potential difference ΔVs, the control current Ict is determined by the following equation (2).

$$Ict = 2 \times \Delta Vs / Ra \quad (2)$$

In accordance with the control current Ict and the resistor element Rt, the potential difference ΔVt determined by the following equation (3) is generated across the resistor element Rt.

$$\Delta Vt = Ict \times Rt \quad (3)$$

Therefore, the potential difference ΔVt is determined by the following equation (4) obtained from the above equations (1) to (3).

$$\Delta Vt = 2 \times Rt \times Rs / Ra \times Iout \quad (4)$$

The values of the resistor element Ra and the current measuring resistor element Rs may be determined in the following manner.

First, in the circuit of FIG. 9, the transistor Q1 is operated so as to measure the value of the resistor element R while the substrate current Isub is allowable with the transistor Q1 saturated. In the circuit of FIG. 9 connected with the resistor element R having the above resistance value, the transistor Q1 is operated so as to measure the output current Iout when latch-up occurs. Under the same conditions, the potential of the electrode TUB is stepped up in order to measure the potential difference ΔVt across the resistor element R in a state that no latch-up occurs. The resistor element R, output current Iout and potential difference ΔVt values thus obtained are respectively substituted for Rt, Iout and ΔVt of the equation (4), and thereby, the value of Rs/Ra is determined. The values of the current measuring resistor element Rs and the resistor element Ra are determined so as to satisfy the above Rs/Ra.

According to the first embodiment of the present invention, in the vertical type transistor Q1 formed in the diffusion region for electrically isolating it from other transistors, the potential difference is applied between the collector electrode C and the electrode TUB of the isolation diffusion region in accordance with the current (output current Iout) flowing through the collector electrode C. Thus, when the output current Iout increases with the operation of the transistor Q1, the potential of the electrode Tub also increases. Accordingly, it is possible to limit the current flowing through the collector-emitter junction of the transistor Q2 parasitic on the transistor Q1. As a result, the transistor Q1 and the transistor Q2 can prevent the latch-up phenomenon from occurring.

Further, the potential difference ΔVt between the electrode TUB and the transistor C is determined by the resistor element Rt interposed between the electrode TUB and the transistor C and the control current Ict. The control current Ict is generated by amplifying the collector current of the transistor Q1. In other words, the above potential difference ΔVt is determined in accordance with the magnitude of the control current Ict changing along with the collector current of the transistor Q1. Thus, the value of the resistor element Rt does not need to be large in order to prevent the latch-up. Therefore, it is possible to reduce the value of the substrate current Isub which flows from the emitter electrode E to the substrate electrode SUB as a result of the large value of the resistor element Rt.

Further, the electrode TUB and the collector electrode C are connected via the resistor element Rt. Thus, when the power supply potential Vcc is applied to the electrode TUB, even if the potential beyond the power supply potential Vcc is applied to the output terminal OUT, the following disadvantages can be avoided. That is, it is possible to avoid the disadvantages that the PN junction between the diffusion region tub and the diffusion region c is broken down, and excessive load is applied to an external device connected to the output terminal.

Figure 3:
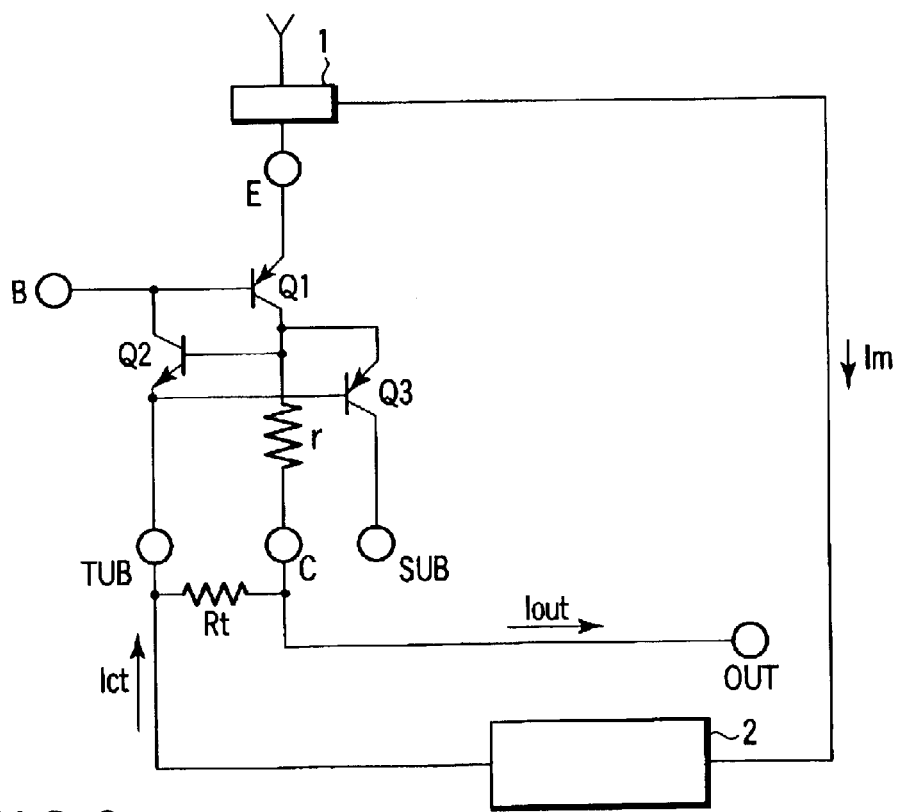
FIG. 3 is a block diagram schematically showing a semiconductor integrated circuit device according to a modification example of the first embodiment of the present invention.

In FIG. 1, the current measuring section 1 measures the collector current. As shown in FIG. 3, however, the current measuring section 1 is provided at the pre-stage of the emitter electrode E of the transistor Q1 and the control current Ict may be generated using the emitter current of the transistor Q1.

Of course, each of the resistor element Rt, current measuring section 1 and control section 2 may be formed in the semiconductor substrate sub with the transistor Q1.

Second Embodiment

The second embodiment relates to the modification example of the first embodiment. In the second embodiment, the functional block diagram is the same as FIG. 1 or FIG. 3, the circuit configuration of the control section 2 differs from the first embodiment.

Figure 4:
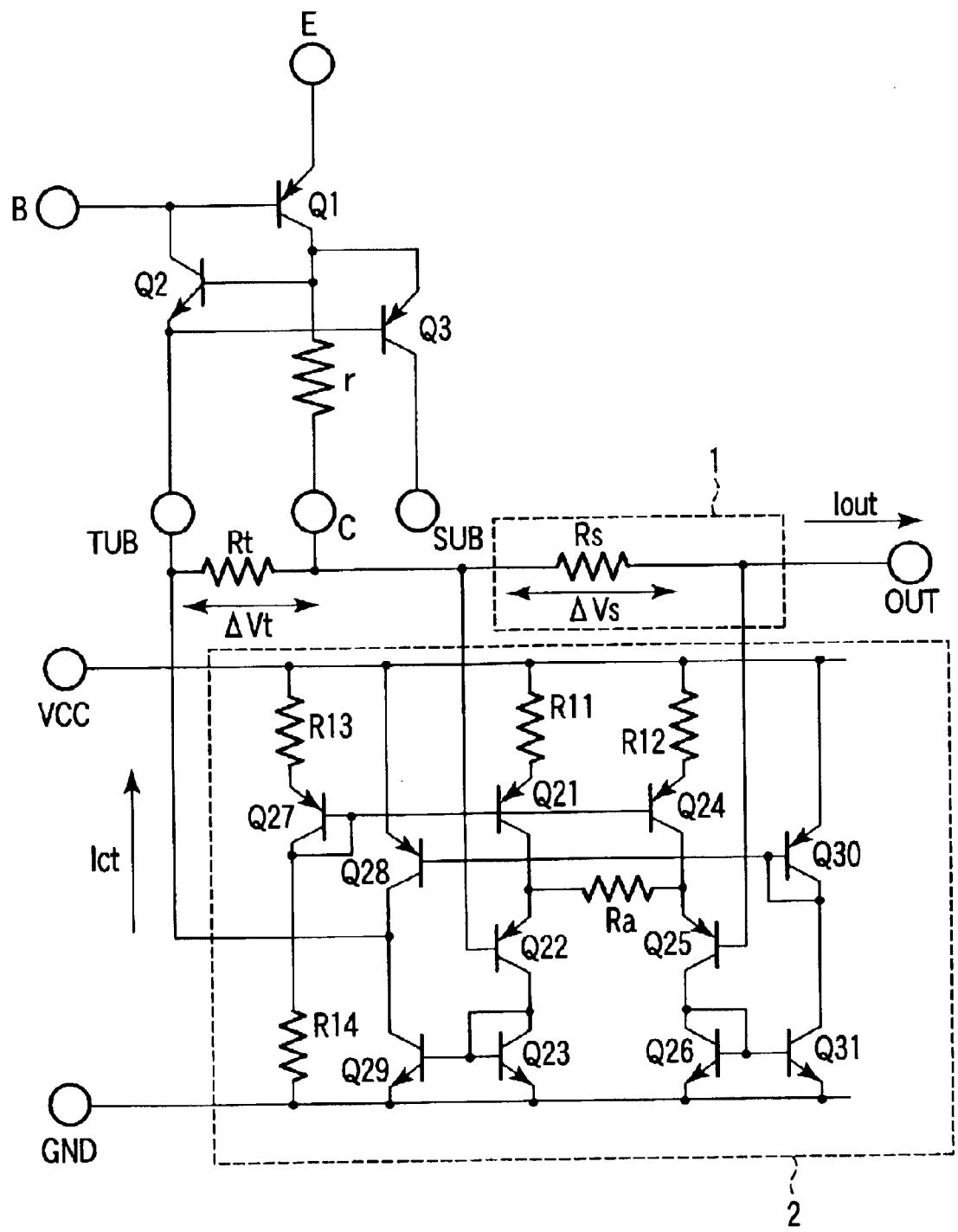
FIG. 4 is a view schematically showing a semiconductor integrated circuit device according to a second embodiment of the present invention.

FIG. 4 shows a semiconductor integrated circuit device according to the second embodiment of the present invention, and is a block diagram showing the circuit configuration for realizing the circuit shown in FIG. 1 or FIG. 3.

The power supply terminal VCC is grounded via series-connected resistor element R11, a pnp-type transistor Q21, a pnp-type transistor Q22 and an npn-type transistor Q23. Further, the power supply terminal VCC is grounded via series-connected resistor element R12, a pnp-type transistor Q24, a pnp-type transistor Q25 and an npn-type transistor Q26. The resistor element Ra is interposed between the emitter of the transistor Q22 and the emitter of the transistor Q25.

The base of the transistor Q22 is connected with a connection node of the current measuring resistor element Rs and the collector electrode C. The base of the transistor Q25 is connected with a connection node of the current measuring resistor element Rs and the output terminal OUT. The base of the transistor Q23 is connected with the collector thereof. The base of the transistor Q26 is connected with the collector thereof.

The power supply terminal VCC is further grounded via series-connected resistor element R13, a pnp-type transistor Q27 and resistor element R14. The base of the transistor Q27 is connected with the collector thereof, each base of the transistor Q21 and the transistor Q24.

The power supply terminal VCC is further grounded via series-connected a pnp-type transistor Q28 and an npn-type transistor Q29. The collector of the transistor Q28 is connected with the electrode TUB so that the control current Ict can be fetched from the collector of the transistor Q28. The base of the transistor Q29 is connected with the base of the transistor Q23.

The power supply terminal VCC is further grounded via series-connected a pnp-type transistor Q30 and an npn-type transistor Q31. The base of the transistor Q30 is connected with the collector thereof and the base of the transistors Q28. The base of the transistor Q31 is connected with the base of the transistor Q26.

The operation of the semiconductor integrated circuit device having the above configuration is the same as the first embodiment. That is, the control current Ict is supplied to the electrode TUB in accordance with a potential difference ΔVs changing along with the output current Iout. As a result, the same operation as the first embodiment can be carried out.

According to the second embodiment, the same effect as the first embodiment. In addition, according to the second embodiment, the transistor Q22 and the transistor Q30 connected with both terminals of the current measuring resistor element Rs in the control section 2 are of pnp type. Thus, even if the potential of the output terminal OUT steps down to approximately 0 V, the transistor Q22 and the transistor Q25 can be normally operated without cut-off.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:

a first conduction type semiconductor substrate;

a second conduction type first diffusion region formed in a surface of the semiconductor substrate;

a first conduction type second diffusion region formed in the first diffusion region;

a second conduction type third diffusion region formed in the second diffusion region;

a first conduction type fourth diffusion region formed in the third diffusion region;

a current measuring section measuring a current value of current flowing through the second diffusion region, and outputting a current value signal in accordance with the measured current value;

a control section supplied with the current value signal, and supplying control current to the first diffusion region in accordance with the current value signal; and a first resistor element having a first terminal connected with the first diffusion region, and a second terminal connected with the second diffusion region.

2. The device according to claim 1, wherein the control current is a signal proportional to the current value signal.

3. The device according to claim 1, wherein the current measuring section comprises a second resistor element.

4. The device according to claim 3, wherein the control section comprises a differential amplifier circuit, amplifies a potential difference between a first terminal and a second terminal of the second resistor element, and supplies the control current in accordance with the amplified potential difference.

5. The device according to claim 4, wherein the first terminal and the second terminal of the second resistor element are connected to bases of a pnp-type first transistor and a pnp-type second transistor, respectively, and the first transistor and the second transistor form an input section of the differential amplifier circuit.

6. A semiconductor integrated circuit device comprising:

a first conduction type semiconductor substrate;

a second conduction type first diffusion region formed in a surface of the semiconductor substrate;

a first conduction type second diffusion region formed in the first diffusion region;

a second conduction type third diffusion region formed in the second diffusion region;

a first conduction type fourth diffusion region formed in the third diffusion region;

a current measuring section measuring a current value of current flowing through the fourth diffusion region, and outputting a current value signal in accordance with the measured current value;

a control section supplied with the current value signal, and supplying control current to the first diffusion region in accordance with the current value signal; and a first resistor element having a first terminal connected with the first diffusion region, and a second terminal connected with the second diffusion region.

7. The device according to claim 6, wherein the control current is a signal proportional to the current value signal.

8. The device according to claim 6, wherein the current measuring section comprises a second resistor element.

9. The device according to claim 6, wherein the control section comprises a differential amplifier circuit, amplifies a potential difference between a first terminal and a second terminal of the second resistor element, and supplies the control current in accordance with the amplified potential difference.

10. The device according to claim 6, wherein the first terminal and the second terminal of the second resistor element are connected to bases of a pnp-type first transistor and a pnp-type second transistor, respectively, and the first transistor and the second transistor form an input section of the differential amplifier circuit.

* * * * *